US 9,159,722 B2

(12) United States Patent
Ogura et al.

(10) Patent No.: US 9,159,722 B2
(45) Date of Patent: Oct. 13, 2015

(54) SEMICONDUCTOR DEVICE

(71) Applicant: KABUSHIKI KAISHA TOSHIBA, Tokyo (JP)

(72) Inventors: Tsuneo Ogura, Kamakura Kanagawa (JP); Shinichiro Misu, Machida Tokyo (JP); Ryohei Gejo, Yokohama Kanagawa (JP); Norio Yasuhara, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/340,180

(22) Filed: Jul. 24, 2014

(65) Prior Publication Data

US 2015/0155277 A1 Jun. 4, 2015

(30) Foreign Application Priority Data

Dec. 4, 2013 (JP) ................. 2013-251350

(51) Int. Cl.
*H01L 27/07* (2006.01)
*H01L 29/739* (2006.01)
*H01L 29/861* (2006.01)
*H01L 29/06* (2006.01)

(52) U.S. Cl.
CPC ........ *H01L 27/0761* (2013.01); *H01L 29/0626* (2013.01); *H01L 29/7397* (2013.01); *H01L 29/861* (2013.01)

(58) Field of Classification Search
CPC ............ H01L 27/0716; H01L 27/0761; H01L 29/7397
USPC ......................................... 257/140
See application file for complete search history.

(56) References Cited

U.S. PATENT DOCUMENTS

2012/0043581 A1* 2/2012 Koyama et al. ............... 257/140

FOREIGN PATENT DOCUMENTS

JP 2009141202 A 6/2009

* cited by examiner

*Primary Examiner* — Daniel Shook
(74) *Attorney, Agent, or Firm* — Patterson & Sheridan, LLP

(57) ABSTRACT

A semiconductor device includes a transistor region and diode region. A plurality of transistors is in the transistor region and at least one diode is in the diode region. The transistors include first and second body regions of a first conductivity type. The dopant concentration in the second body region is greater than the dopant concentration in the first body region. The diode includes first and second anode regions of the first conductivity type. The dopant concentration in the second anode region is greater than the dopant concentration in the first anode region. A total dopant amount in the second body region within a first block portion of the semiconductor substrate is greater than a total dopant amount in the second anode layer within a second block portion of the semiconductor substrate of the same size as the first block portion.

20 Claims, 4 Drawing Sheets

SEMICONDUCTOR DEVICE

CROSS-REFERENCE TO RELATED APPLICATION

This application is based upon and claims the benefit of priority from Japanese Patent Application No. 2013-251350, filed Dec. 4, 2013, the entire contents of which are incorporated herein by reference.

FIELD

Embodiments described herein relate generally to a semiconductor device.

BACKGROUND

In some cases, an inverter used in power converters is formed with an insulated gate bipolar transistor (IGBT) and a free wheeling diode (FWD) that are connected in antiparallel. The FWD connected to the IGBT in this manner operates to protect the IGBT by preventing a reverse current from flowing in the IGBT.

In order to downsize the inverter, there has been proposed a semiconductor device with the IGBT and the FWD formed on the same semiconductor substrate a so-called reverse-conducting IGBT (RC-IGBT). But the respective operating characteristics of the IGBT and the FWD when formed on the same semiconductor substrate have to be improved to improve the operating characteristics of the reverse-conducting IGBT.

DETAILED DESCRIPTION

Figure 1A:
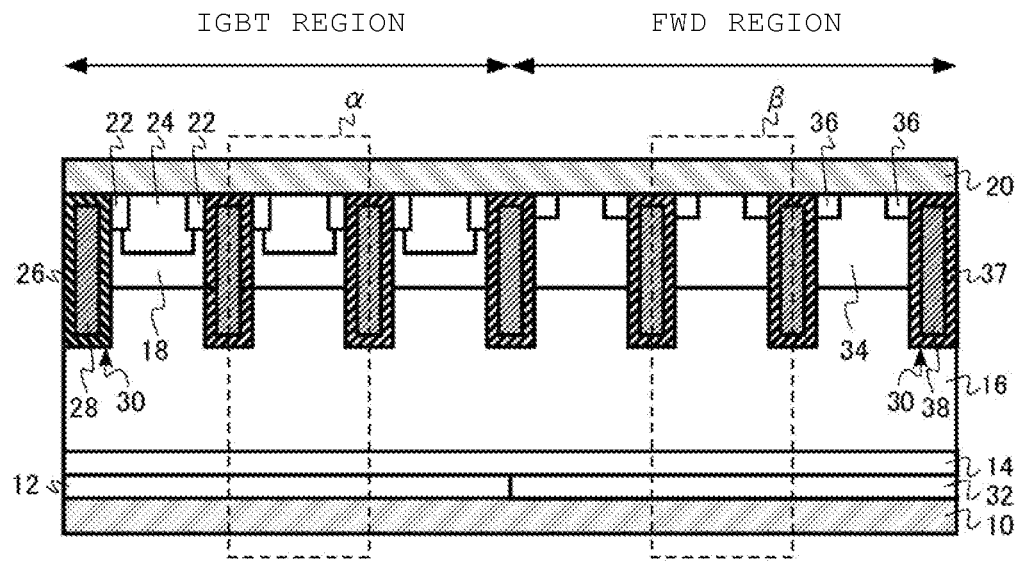
FIGS. 1A and 1B are schematic views of a portion of a semiconductor device according to a first embodiment.

According to an embodiment, a semiconductor device includes a first electrode disposed on a first surface of a semiconductor substrate and a second electrode disposed on a second surface of the semiconductor substrate. The second surface is opposite the first surface. A first semiconductor region having a first conductivity type is disposed between the first and second electrodes. A first element (e.g., transistor) region of the semiconductor substrate includes a collector region of a second conductivity type between the first semiconductor region and the first electrode, a first body region of the second conductivity type between the first semiconductor region and the second electrode, and a second body region of the second conductivity type between the first body region and the second electrode. The second body region is contacting the second electrode. A concentration of second conductivity type dopant in the second body region is greater than a concentration of second conductivity type dopant in the first body region. The first element region also includes an emitter region of the first conductivity type between the first body region and the second electrode and contacting the second electrode. A first plurality of gate electrodes is between the first and second electrodes and the gate electrodes are spaced from each other in a first direction parallel to the first surface. Each gate electrode in the first plurality is adjacent to the first semiconductor region, the first body region, and the emitter region via a gate insulating film. The semiconductor device also includes a second element (e.g., diode) region of the semiconductor substrate. In the second element region there is a cathode region of the first conductivity type between the first semiconductor region and the first electrode, a first anode region of the second conductivity type between the first semiconductor region and the second electrode, and a second anode region of the second conductivity type disposed between the first anode region and the second electrode and contacting the second electrode. A concentration of second conductivity type dopant in the second anode region is greater than a concentration of second conductivity type dopant in the first anode region. The semiconductor device is fabricated such that a total second conductivity type dopant amount of the second body region in the first element region and within a first block portion of the semiconductor substrate is greater than a total second conductivity type dopant amount of the second anode layer in the second element region within a second block portion of the semiconductor substrate, the first block portion having a width in the first direction that is equal to a spacing between adjacent gate electrodes in the first plurality of gate electrodes and a length of a predetermined distance in a second direction, parallel to the first surface and perpendicular to the first direction, the second block portion having a width and a length that is the same as the first block portion.

Example embodiments will be described with reference to the drawings. In the following description, the reference numerals corresponding to the same elements in different drawings are repeated and the description of elements already described in a drawing may be omitted in description of subsequent drawings.

In this disclosure, the terms $n^+$ type, n type, and $n^-$ type refer to the effective concentration of n type dopants in a material. The n-type dopant concentration is in a decreasing order from $n^+$ type, n type, to $n^-$ type. Similarly, $p^+$ type, p type, and $p^-$ type refer the effective concentration of p type dopants. The p-type concentration is in a decreasing order from $p^+$ type, p type, to $p^-$ type.

In this disclosure, "dopant concentration" refers to the effective concentration of a dopant element attributing the conductivity of a semiconductor material. For example, when an n type dopant element, which functions as a donor, and a p type dopant element, which functions as an acceptor, are included in a semiconductor material, the concentration of the dopant element left after neutralization by the other dopant element is defined as "dopant concentration". Further, the dopant concentration of a semiconductor layer or a semiconductor region means the maximum dopant concentration in each semiconductor layer or each semiconductor region, unless otherwise specified.

(First Embodiment)

A semiconductor device of an example embodiment is provided with a transistor region in which transistors are disposed. Each transistor in the transistor region includes a collector electrode, an emitter electrode, a first conductivity semiconductor collector layer provided between the collector electrode and the emitter electrode, a second conductivity semiconductor base layer provided between the collector layer and the emitter electrode, a first conductivity semiconductor first body layer provided between the base layer and the emitter electrode, a second conductivity semiconductor emitter layer provided between the first body layer and the emitter electrode, a first conductivity semiconductor second body layer having a higher first conductivity type dopant concentration than the first body layer, which is provided between the first body layer and the emitter electrode, a gate electrode, and a gate insulating film provided between the layers of the base layer, the first body layer, and the emitter layer and the gate electrode. Further, it is provided with a diode region in which there is arranged a diode including a cathode electrode, an anode electrode provided on the cathode electrode with the base layer interposed therebetween, a first conductivity semiconductor first anode layer provided between the base layer and the anode electrode, and a first conductivity semiconductor second anode layer having a higher first conductivity type dopant concentration than the first anode layer, which is provided between the first anode layer and the anode electrode. The dopant amount of a first conductivity type dopant in the second body layer within a first block surrounded by a repeating pitch of the transistor in the transistor region and a predetermined length in a direction perpendicular to the repeating direction is more than the dopant amount of the first conductivity type dopant in the second anode layer within a second block having the same size as the first block in the diode region.

Figure 1B:
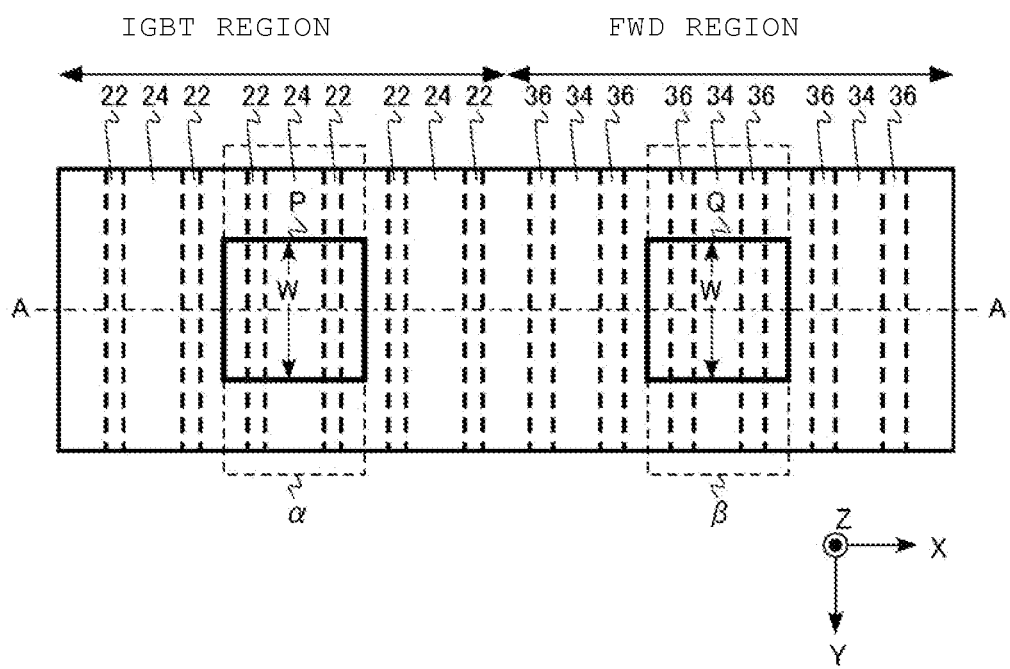

FIGS. 1A and 1B are schematic views of a portion of the semiconductor device according to the first embodiment. FIG. 1A is a schematic cross sectional view of the portion and FIG. 1B is a schematic plan view of the portion. FIG. 1A is a cross section taken along AA in FIG. 1B. In FIG. 1B, emitter electrodes and anode electrodes indicated in FIG. 1A are not shown.

The semiconductor device of the first embodiment is a reverse-conducting IGBT in which IGBTs and FWDs are formed on the same semiconductor substrate. Hereinafter, a description of this example embodiment will be made for a device where the first conductivity type is a p type and the second conductivity type is an n type.

As illustrated in FIGS. 1A and 1B, the reverse-conducting IGBT of the embodiment includes an IGBT region (transistor region) where IGBTs are repeated in the X direction and an FWD region (diode region) where FWDs are repeated in the X direction. The IGBT region and the diode region are on the same semiconductor substrate.

An area represented by a dashed rectangle α in FIGS. 1A and 1B corresponds to a repeating unit of the IGBTs (transistor repeat unit). Further an area represented by a dashed rectangle β in FIGS. 1A and 1B corresponds to a repeating unit of the FWDs (diode repeating unit).

In FIG. 1A and FIG. 1B, a case where IGBTs (transistors) and FWDs (diodes) are arranged at the same repeating pitch and along the same direction by the same repeating unit is depicted. However, the repeating unit of the IGBT does not necessarily have to be identical to that of the FWD. Further, the repeating direction and the repeating pitch do not necessarily have to be identical to those of the FWD. Alternatively, the FWD may be a single diode rather than a plurality of diodes in repetition.

The depicted IGBT has a layer structure including a first electrode 10, a $p^+$ type collector layer 12, an n type buffer layer 14, an $n^-$ type base layer 16, a p type first body layer 18, and a second electrode 20 that are stacked in this order. In the IGBT region, the first electrode corresponds to a collector electrode and, the second electrode corresponds to an emitter electrode. When discussing the IGBT region, the first electrode 10 may be referred to as a collector electrode 10 and the second electrode 20 may be referred to as an emitter electrode 20. Between the first body layer 18 and the second electrode 20, an $n^+$ type emitter layer 22 and a $p^+$ type second body layer 24 are provided.

Further, a gate insulating film 26 is provided between the $n^-$ type base layer 16, the p type first body layer 18, and the $n^+$ type emitter layer 22 respectively and a gate electrode 28, in the IGBT of the embodiment. The gate electrode 28 is formed within a trench 30.

In the IGBT region, trenches 30 extend from the second electrode 20 toward the first electrode 10 with a first end on the side of the emitter layer 22 and a second end on the side of the base layer 16. That is, the trenches 30 extend in the Z direction within the semiconductor substrate, as illustrated in FIG. 1A and, in the IGBT region, a gate electrode 28 extends in the Z direction within each trench 30.

The depicted IGBT is a so-called trench IGBT with a gate electrode formed within a trench (e.g., trench 30). The $n^-$ type base layer 16, the p type first body layer 18, the $n^+$ type emitter layer 22, the gate insulating film 26, and the gate electrode 28 form a structure of Metal Insulator Semiconductor Field Effect Transistor (MISFET).

The depicted FWD has a layer structure including the first electrode 10, an $n^+$ type cathode layer 32, the n type buffer layer 14, the $n^-$ type base layer 16, a p type first anode layer 34, and an anode electrode 20 stacked in this order. A $p^+$ type second anode layer 36 is provided between the first anode layer 34 and the second electrode 20. In the FWD region, the first electrode 10 may be referred to as a cathode electrode 10 and the second electrode 20 may be referred to as an anode electrode 20.

In the FWD region, a trench electrode 38 is provided within each of the trenches 30. An insulating film 37 is provided between the trench electrode 38 and the material(s) in which the trench 30 has been formed. In general, as depicted, the structures of trench electrode 38 and gate electrode 28 are the same. During device operation, the trench electrode 38 may have a potential that is fixed, for example, at the same potential as the anode electrode 20.

The collector electrode 10 of the IGBT and the cathode electrode 10 of the FWD are formed in common in this embodiment. The emitter electrode 20 of the IGBT and the anode electrode 20 of the FWD are also formed in common in this embodiment.

The FWD is a PiN diode in this embodiment.

A semiconductor substrate on which the IGBT region and the FWD region are provided is, for example, a single crystal silicon substrate with a surface (100) defined as a main surface.

The $p^+$ type collector layer 12, the n type buffer layer 14, the $n^-$ type base layer 16, the p type first body layer 18, the $n^+$ type emitter layer 22, the $p^+$ type second body layer 24, the $n^+$ type cathode layer 32, the p type first anode layer 34, and the $p^+$ type second anode layer 36 are a semiconductor material including p type dopant or n type dopant as indicated. The semiconductor material is, for example, single crystal silicon (Si). The p type dopant is, for example, boron (B) and the n type dopant is, for example, phosphorus (P) or arsenic (As).

The first electrode 10 in this embodiment comprises metal selected from a group of, for example, aluminum (Al), titanium (Ti), nickel (Ni), tungsten (W), and gold (Au). While in this embodiment the first electrode 10 is both the collector electrode and the cathode electrode formed in common, the first electrode 10 could be provided such that different metals or materials are used in the IGBT and FWD region.

The $p^+$ type collector layer 12 is provided on the collector electrode 10. The collector electrode 10 can be connected to the p+ type collector layer 12 through ohmic contact. The p type dopant concentration of the p+ type collector layer 12 is, for example, in the range of $1\times10^{19}$ atoms/cm$^3$ and $1\times10^{21}$ atoms/cm$^3$ inclusive.

The n type buffer layer 14 is provided on the p+ type collector layer 12. The n type dopant concentration of the n type buffer layer 14 is higher than the n type dopant concentration of the n− type base layer 16. When the IGBT is in an ON state (that is, conducting between collector and emitter electrodes), the n type buffer layer 14 restrains the amount of holes injected from the collector electrode 10. When the IGBT is in an OFF state (that is, non-conducting between collector and emitter electrode), n-type buffer layer restrains growth of the depletion layer. The n type dopant concentration of the n type buffer layer 14 is, for example, in the range of $1\times10^{17}$ atoms/cm$^3$ and $1\times10^{19}$ atoms/cm$^3$ inclusive.

The n− type base layer 16 is provided on the n type buffer layer 14. The n− type base layer 16 operates as a drift layer of the IGBT. The n type dopant concentration of the n− type base layer 16 is, for example, in the range of $1\times10^{14}$ atoms/cm$^3$ and $1\times10^{15}$ atoms/cm$^3$ inclusive.

The p type first body layer 18 is provided on the n− type base layer 16. The p type first body layer 18 operates as a channel region of the IGBT. When in an OFF state, p type first body layer 18 has a function of preserving a breakdown voltage. Accordingly, the p type first body layer 18 is optimized mainly from the viewpoint of threshold control and breakdown voltage of the IGBT. The p type dopant concentration of the p type first body layer 18 is, for example, in the range of $1\times10^{16}$ atoms/cm$^3$ and $1\times10^{18}$ atoms/cm$^3$ inclusive.

The n+ type emitter layer 22 is provided between the p type first body layer 18 and the emitter electrode 20. The n+ type emitter layer 22 is provided in contact with the p type first body layer 18. The n type dopant concentration of the n+ type emitter layer 22 is, for example, in the range of $1\times10^{19}$ atoms/cm$^3$ and $1\times10^{21}$ atoms/cm$^3$ inclusive.

The p+ type second body layer 24 is provided between the p type first body layer 18 and the emitter electrode 20. The p+ type second body layer 24 operates as a dopant layer for extracting holes. The p type dopant concentration of the p+ type second body layer 24 is higher than that of the p type first body layer 18. The p type dopant concentration of the p+ type second body layer 24 is, for example, in the range of $1\times10^{19}$ atoms/cm$^3$ and $1\times10^{21}$ atoms/cm$^3$ inclusive.

The p+ type second body layer 24 is provided in contact with the p type first body layer 18. The boundary between the p+ type second body layer 24 and the p type first body layer 18 is defined by the position in the concentration profile of the p type dopant across the p+ type second body layer 24 and the p type first body layer 18 where the p type dopant concentration profile has the steepest slope.

The p+ type second body layer 24 of high dopant concentration is provided in order to help prevent the pn junction from getting a forward bias voltage caused by a deterioration of a barrier between the first body layer 18 and the n+ type emitter layer 22 according to a hole current flowing during on (conducting) operation. According to this, the IGBT may be protected against generation of latch-up.

From the viewpoint of improving a latch-up suppression effect, it is preferable that the boundary between the p+ type second body layer 24 and the p type first body layer 18 should be under the n+ type emitter layer 22, as illustrated in FIG. 1A. In other words, the depth of the p type first body layer 18 is greater than that of the n+ type emitter layer 22 and the boundary between the p+ type second body layer 24 and the p type first body layer 18 is preferably positioned closer to the side of the trench 30 than the boundary between the p+ type second body layer 24 and the n+ type emitter layer 22 on the semiconductor substrate surface.

Further, the p+ type second body layer 24 also reduces contact resistance of the emitter electrode 20. According to this, an on voltage of the IGBT is reduced.

In the IGBT region, the gate insulating film 26 is provided within the trenches 30 in contact with the n− type base layer 16, the p type first body layer 18, and the n+ type emitter layer 22. Gate insulating film 26 is, for example, a silicon oxide film. A silicon nitride film, a silicon oxynitride film, and the other insulating material can be used for the gate insulating film 26. Further, a stacked film of two and more insulating materials may be used for the gate insulating film 26.

The gate electrode 28 provided within the trench 30 in contact with the gate insulating film 26 is, for example, polycrystalline silicon including n type dopant. Conductive materials other than the polycrystalline silicon may be also used for the gate electrode 28.

The emitter electrode 20 is provided on the n+ type emitter layer 22 and the p+ type second body layer 24. As noted emitter electrode 20 may comprise metal selected from a group of, for example, aluminum (Al), titanium (Ti), nickel (Ni), tungsten (W), and gold (Au). The emitter electrode 20 can be connected to the n+ type emitter layer 22 and the p+ type second body layer 24 through an ohmic contact.

As previously noted, the cathode electrode 10 forming the FWD can comprise metal selected from a group of, for example, aluminum (Al), titanium (Ti), nickel (Ni), tungsten (W), and gold (Au).

The n+ type cathode layer 32 is provided on the cathode electrode 10. The cathode electrode 10 can be connected to the n+ type cathode layer 32 through an ohmic contact. The n type dopant concentration of the n+ type cathode layer 32 is, for example, in the range of $1\times10^{19}$ atoms/cm$^3$ and $1\times10^{21}$ atoms/cm$^3$ inclusive.

In the FWD region, the n type buffer layer 14 is provided on the n+ type cathode layer 32. As in noted with respect to the IGBT region, the n type dopant concentration of the n type buffer layer 14 is higher than that of the n− type base layer 16. The n type buffer layer 14 has a function of restraining a growth of a depletion layer during OFF operation of the FWD. The n type dopant concentration of the n type buffer layer 14 is, for example, in the range of $1\times10^{17}$ atoms/cm$^3$ and $1\times10^{19}$ atoms/cm$^3$ inclusive.

The n− type base layer 16 is provided on the n type buffer layer 14. The n− type base layer 16 operates as a drift layer of the FWD. The n type dopant concentration of the n type base layer 16 is, for example, in the range of $1\times10^{14}$ atoms/cm$^3$ and $1\times10^{15}$ atoms/cm$^3$ inclusive.

In the FWD region, the p type first anode layer 34 is provided on the n− type base layer 16. The p type first anode layer 34 has a function of preserving a breakdown voltage at the off (non-conducting) operation of the FWD. The same dopant profile as the p type first body layer 18 in the IGBT region or a different dopant profile can be applied to the p type first anode layer 34. The p type dopant concentration of the p type first anode layer 34 is, for example, in the range of $1\times10^{16}$ atoms/cm$^3$ and $1\times10^{18}$ atoms/cm$^3$ inclusive.

The p+ type second anode layer 36 is provided between the p type first anode layer 34 and the anode electrode 20. The p+ type second anode layer 36 operates as a dopant layer for hole injection. The p type dopant concentration of the p+ type second anode layer 36 is higher than that of the p type first anode layer 34. The p type dopant concentration of the p+ type second anode layer 36 is, for example, in the range of $1\times10^{19}$ atoms/cm$^3$ and $1\times10^{21}$ atoms/cm$^3$ inclusive.

The p+ type second anode layer 36 is provided in contact with the p type first anode layer 34. The boundary between the p+ type second anode layer 36 and the p type first anode layer 34 is defined by the position, for example, where the concentration profile of the p type dopant across the p type first anode layer 34 and p+ second anode layer 36 is most steeply sloped—that is, where the concentration level changes the most with position.

The p+ type second anode layer 36 reduces a contact resistance of the anode electrode 20 allowing the forward current of the FWD to be increased.

In the FWD region, the anode electrode 20 is provided on the p type first anode layer 34 and the p+ type second anode layer 36. The anode electrode 20 comprises metal selected from a group of, for example, aluminum (Al), titanium (Ti), nickel (Ni), tungsten (W), and gold (Au). The anode electrode 20 can be connected to the p+ type second anode layer 36 through an ohmic contact. The anode electrode 20 is connected to the p type first anode layer 34, for example, through a Schottky-type contact.

In the reverse-conducting IGBT of the first embodiment, the dopant amount of the p type dopant in the p+ type second body layer 24 within a first block (P in FIG. 1B) having a first dimension corresponding to the repeating pitch of the IGBT (transistors) and a second dimension of a predetermined length (W in FIG. 1B) perpendicular to the repeating direction of the IGBT (transistors) in the IGBT region (transistor region) is greater than the dopant amount of the p type dopant in the p+ type second anode layer 36 within a second block (Q in FIG. 1B) having the same size as the first block (P in FIG. 1B) in the FWD region (diode region).

Here, the "dopant amount" of the p type dopant in the p+ type second body layer 24 within the first block (P in FIG. 1B) indicates the total amount of all the p type dopant included in the p+ type second body layer 24 within the first block (P in FIG. 1B). That is, the "dopant amount" of the p type dopant as used here is not just an amount of p type dopant exceeding the n type dopant level in the same p+ type second body layer 24, but rather a total count of p-type dopants. Thus, the "dopant amount" here is not just the "active" portion of the p type dopants above the level of n type dopants also present in the p+ type second body layer, but rather a total amount of p type dopant in the layer without reference to the amount of n type dopant also present in the layer.

Similarly, the dopant amount of the p type dopant in the p+ type second anode layer 36 within the second block (Q in FIG. 1B) indicates the total amount of all the p type dopant included in the p+ type second anode layer 36 within the second block (Q in FIG. 1B).

The shape (e.g., width and depth) and the dopant concentration of the p+ type second body layer 24 in the IGBT are optimized mainly from the viewpoint of latch-up suppression and contact resistance reduction with the emitter electrode 20. From the viewpoint of the latch-up suppression, it is desired that the p type dopant concentration should be higher, even in the depth direction, to reduce resistance. It is also desired that the p+ type second body layer 24 should extend further into layer 18 in the Z direction than the n+ type emitter layer 22. That is, the depth of p+ type second body layer 24 should be greater than the depth of n+ type emitter layer 22. When a distance between a bottom of p+ type second body 24 and the first electrode 10 is less than a distance between a bottom of n+ type emitter layer 22 and the first electrode 10 it is possible to reduce resistance while not affecting a threshold of the IGBT. Thus, in general, the width of the p+ type second body layer 24 should be wide and deep and the p type dopant concentration should be higher on the whole to provide reduced ON state resistance. From the viewpoint of contact resistance reduction, the p type dopant concentration level should be preferably high especially at the boundary with the emitter electrode 20.

On the other hand, the p+ type second anode layer 36 in the FWD is optimized mainly from the viewpoint of suppression of hole injection amount for speed-up in the FWD and contact resistance reduction in the anode electrode 20. From the viewpoint of the suppression of the hole injection amount, it is preferable that the width and the depth of the p+ type second anode layer 36 should be controlled while keeping the p type dopant concentration constant. The hole injection amount from the p+ type second anode layer 36 is in proportion to the p type dopant amount in the p+ type second anode layer 36. From the viewpoint of the contact resistance reduction with the anode electrode 20, the p type dopant concentration level should be preferably high especially at the boundary with the anode electrode 20.

As mentioned above, the shape and the dopant concentration of the p+ type second body layer 24 in the IGBT and the p+ type second anode layer 36 in the FWD are optimized from the different viewpoints. The p+ type second body layer 24 in the IGBT region should have preferably a large amount of the p type dopant, especially from the viewpoint of the latch-up suppression, and a low resistance in a wide area. On the other hand, the p+ type second anode layer 36 in the FWD should preferably limit the p type dopant amount, especially from the viewpoint of improving a switching speed while suppressing the hole injection amount.

Accordingly, by making the dopant amount of the p type dopant in the p+ type second body layer 24 within the first block (P in FIG. 1B) more than the dopant amount of the p type dopant in the p+ type second anode layer 36 within the second block (Q in FIG. 1B) both the IGBT characteristics and the FWD characteristics may be optimized. In other words, when the total amount of the p type dopant in the p+ type second body layer 24 included within a block on the XY plane (e.g., block P in FIG. 1B) is defined as $N_{IGBT}$ and the total amount of the p type dopant in the p+ type second anode layer 36 included within the block (e.g., block Q in FIG. 1B) of the same size is defined as $N_{FWD}$, the relation of $N_{IGBT} > N_{FWD}$ should be satisfied, in order to optimize both the IGBT characteristic and the FWD characteristics.

The predetermined length (W in FIG. 1B) in the direction (Y direction) perpendicular to the repeating direction of the IGBT is not restricted particularly. As far as the size (dimensions) of the blocks P and Q, these blocks need only be large enough to reflect the average dopant distribution in the p+ type second body layers 24 in the IGBT region and the average dopant distribution in the p+ type second anode layers 36 in the FWD region, respectively. For example, the block dimension may be at least the repeating pitch of the IGBT.

As illustrated in FIG. 1A, the anode electrode 20 is, in this embodiment, in contact with both the p type first anode layer 34 and the p+ type second anode layer 36. According to this structure, during on operation of the FWD, holes are injected mainly from the p+ type second anode layer 36. Accordingly, compared with the case where only the p+ type second anode layer 36 is in contact with the anode electrode 20, the hole injection amount is suppressed. As the result, the transition time of the FWD further speeds up.

Further, as illustrated in FIG. 1A, the depth of the p+type second body layer 24 is, in this embodiment, deeper than the depth of the p+ type second anode layer 36. Here, "depth" means a length (thickness) of each dopant layer in a Z direction (e.g., a layer stacking direction). According to this structure, a latch-up suppression effect in the IGBT is improved and the FWD transition further speeds up according to a reduction of the hole injection amount.

Further, as illustrated in FIG. 1A, it is preferable that the width of each p$^+$ type second body layer 24 should be wider than the width of each p+ type second anode layer 36. Here, the "width" means the minimum dimension of a dopant layer on the XY surface of a semiconductor substrate. According to this structure, a latch-up suppression effect of the IGBT is improved and the FWD transition speeds up according to a reduction of the hole injection amount.

Further, as illustrated in FIG. 1A, the total of the widths for the p$^+$ type second body layer 24 within the block P should be preferably larger than the total of the widths for the p$^+$ type second anode layer 36 within the block Q. According to this structure, the latch-up suppression effect of the IGBT may be improved and the FWD speeds up according to a reduction of the hole injection amount.

The semiconductor device of this embodiment enables both latch-up suppression in the IGBT and high speed according to an improvement of a switching speed in the FWD, hence to improve the operating characteristics of the reverse conducting IGBT.

(Second Embodiment)

A semiconductor device according to this embodiment is similar to that of the first embodiment, expect that a cathode layer (e.g., element 32) in the diode region is divided into a plurality of portions and that a carrier control layer (e.g., element 40) of the first conductivity type is provided between the divided portions of the cathode layers.

Figure 2:
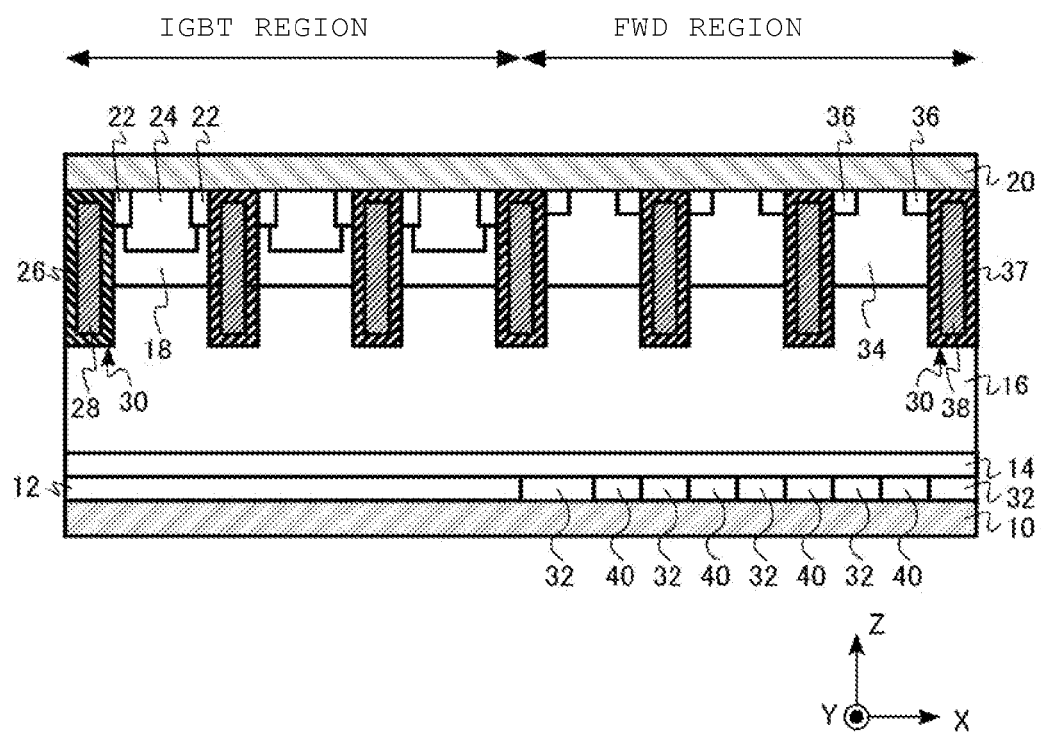
FIG. 2 is a schematic cross sectional view of a portion of a semiconductor device according to a second embodiment.

FIG. 2 is a schematic cross sectional view of the semiconductor device according to the second embodiment. In the semiconductor device according to the second embodiment, as illustrated in FIG. 2, the n$^+$ type cathode layer 32 in the FWD region is divided into a plurality of portions and a p$^+$ type carrier control layer 40 is provided between (in the X-direction) the divided portions of the n$^+$ type cathode layer 32. The divided portions of the n$^+$ cathode layer 32 may be referred to collectively as n$^+$ cathode layers 32. The p$^+$ type carrier control layers 40 between the n$^+$ type cathode layers 32 are interposed (in the Z-direction) between the cathode electrode 10 and the n type buffer layer 14.

The p type dopant concentration of the p$^+$ type carrier control layer 40 is, for example, in the range of $1\times10^{19}$ atoms/cm$^3$ and $1\times10^{21}$ atoms/cm$^3$ inclusive.

At the on operation of the FWD, holes flow in the p$^+$ type carrier control layers 40 and out to the cathode electrode 10. Therefore, the amount of electrons injected from the cathode electrode 10 to the n$^-$ type base layer 16 is suppressed. As the result, further speed-up may be realized according to an improvement of a switching speed in the FWD.

(Third Embodiment)

A semiconductor device according to the third embodiment is similar to that of the first embodiment, except that this semiconductor device includes a second conductivity type semiconductor barrier layer (e.g., element 42) having a higher second conductivity type dopant concentration than the base layer. The second conductivity type semiconductor barrier layer is between the base layer and the first anode layer in the diode region.

Figure 3:
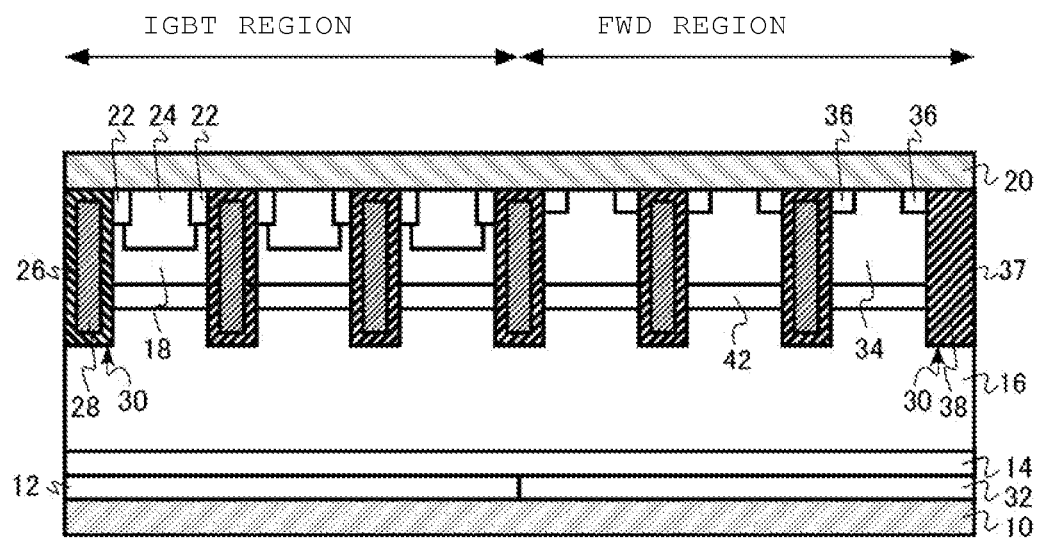
FIG. 3 is a schematic cross sectional view of a portion of a semiconductor device according to a third embodiment.

FIG. 3 is a schematic cross sectional view of the semiconductor device according to the third embodiment. The semiconductor device according to the third embodiment is provided with an n type barrier layer 42 having a higher n type dopant concentration than the n$^-$ type base layer 16. The n type barrier layer 42 is between the n$^-$ type base layer 16 and the p type first anode layer 34 in the FWD region, as illustrated in FIG. 3. The n type barrier layer 42 is also provided between the n$^-$ type base layer 16 and the p type first body layer 18 in the IGBT region.

The n type dopant concentration of the n type barrier layer 42 is, for example, in the range of $1\times10^{16}$ atoms/cm$^3$ and $1\times10^{17}$ atoms/cm$^3$ inclusive.

At the on operation of the IGBT, since the n type barrier layer 42 suppresses hole discharge, an on-voltage may be reduced. Further, at the on operation of the FWD, since the n type barrier layer 42 suppresses hole injection to the n$^-$ type base layer 16, a switching speed is improved and a high speed may be realized.

In the structure where the p$^+$ type second anode layer 36 having a high p type dopant concentration is provided in the FWD, a hole injection from the p type first anode layer 34 to the n$^-$ type base layer 16 is suppressed. On the other hand, a hole injection from the p$^+$ type second anode layer 36 may be maintained. Therefore, the hole injection amount may be optimized.

In a variant of the third embodiment, the n type barrier layer 42 can be provided only in the FWD region and not provided in the IGBT region.

(Fourth Embodiment)

A semiconductor device according to this embodiment is similar to that of the first embodiment, except that a second conductivity type carrier control layer (e.g., element 44) is provided between the first anode layer and the anode electrode in the diode region.

Figure 4:
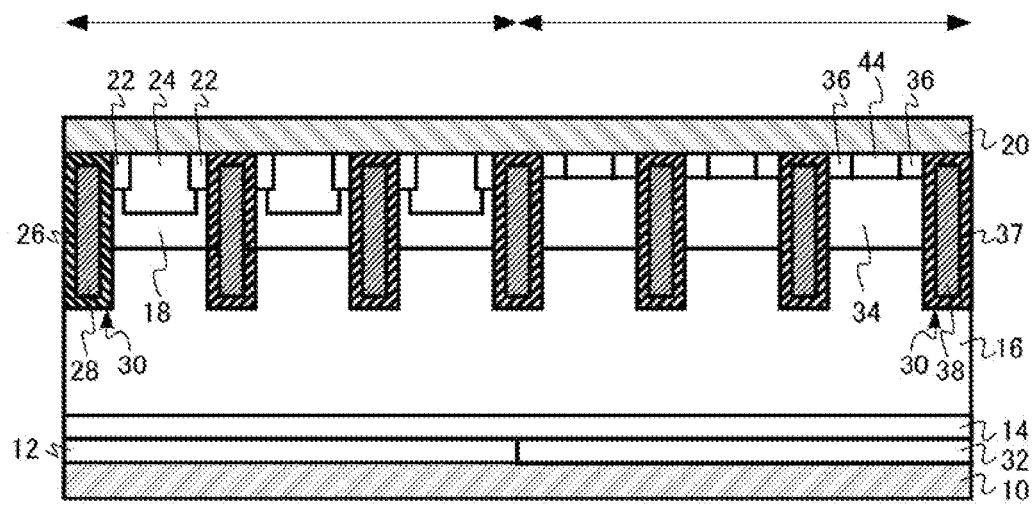
FIG. 4 is a schematic cross sectional view of a portion of a semiconductor device according to a fourth embodiment.

FIG. 4 is a schematic cross sectional view of the semiconductor device according to the fourth embodiment. The semiconductor device according to the fourth embodiment is provided with an n$^+$ type carrier control layer 44 between the p type first anode layer 34 and the anode electrode 20 in the FWD region, as illustrated in FIG. 4. Each of the n$^+$ type carrier control layers 44 is interposed (in the X-direction) between two adjacent p$^+$ type second anode layers 36. The n$^+$ type carrier control layers 44 and the anode electrode 20 are in contact with each other.

The n type dopant concentration of the n$^+$ type carrier control layer 44 is, for example, in the range of $1\times10^{19}$ atoms/cm$^3$ and $1\times10^{21}$ atoms/cm$^3$ inclusive.

At the on operation of the FWD, by providing the n type carrier control layer 44 between (in the Z-direction) the p type first anode layer 34 and the anode electrode 20, discharge of electrons to the anode electrode 20 is accelerated. Therefore, a switching speed is improved and a high speed may be realized.

(Fifth Embodiment)

A semiconductor device according to this fifth embodiment is similar to that of the first embodiment, except that a trench structure is not provided in the FWD region.

Figure 5:
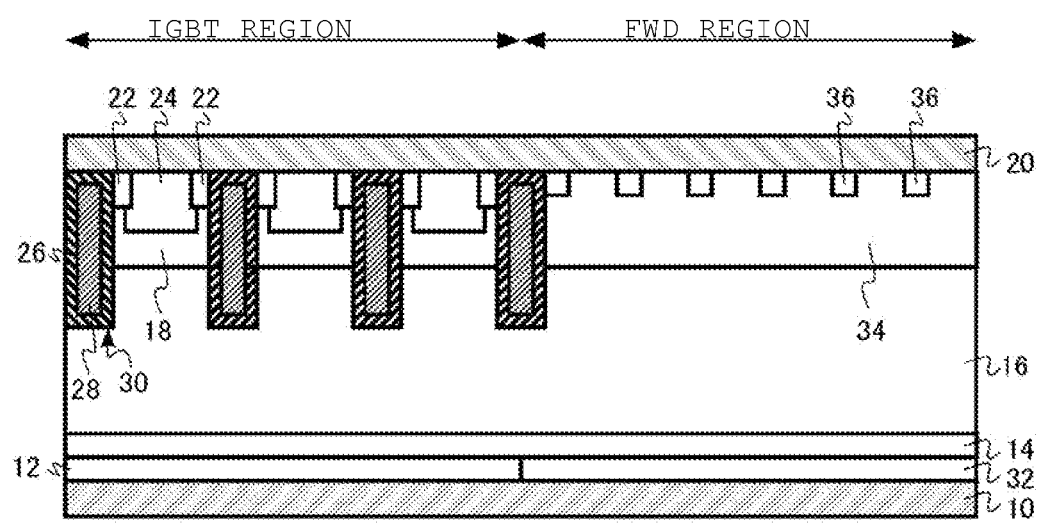
FIG. 5 is a schematic cross sectional view of a portion of a semiconductor device according to a fifth embodiment.

FIG. 5 is a schematic cross sectional view of the semiconductor device according to the fifth embodiment. The reverse conducting IGBT of the fifth embodiment is not provided with any trench structures (e.g., elements 30) in the FWD region, as illustrated in FIG. 5.

The semiconductor device of the fifth embodiment enables both latch-up suppression in the IGBT and high speed according to an improvement of a switching speed in the FWD, similarly to the first embodiment.

(Sixth Embodiment)

A semiconductor device according to this sixth embodiment is similar to that of the first embodiment, excepting that the IGBT is not a trench IGBT and that the trench structure is not provided in the FWD region.

Figure 6:
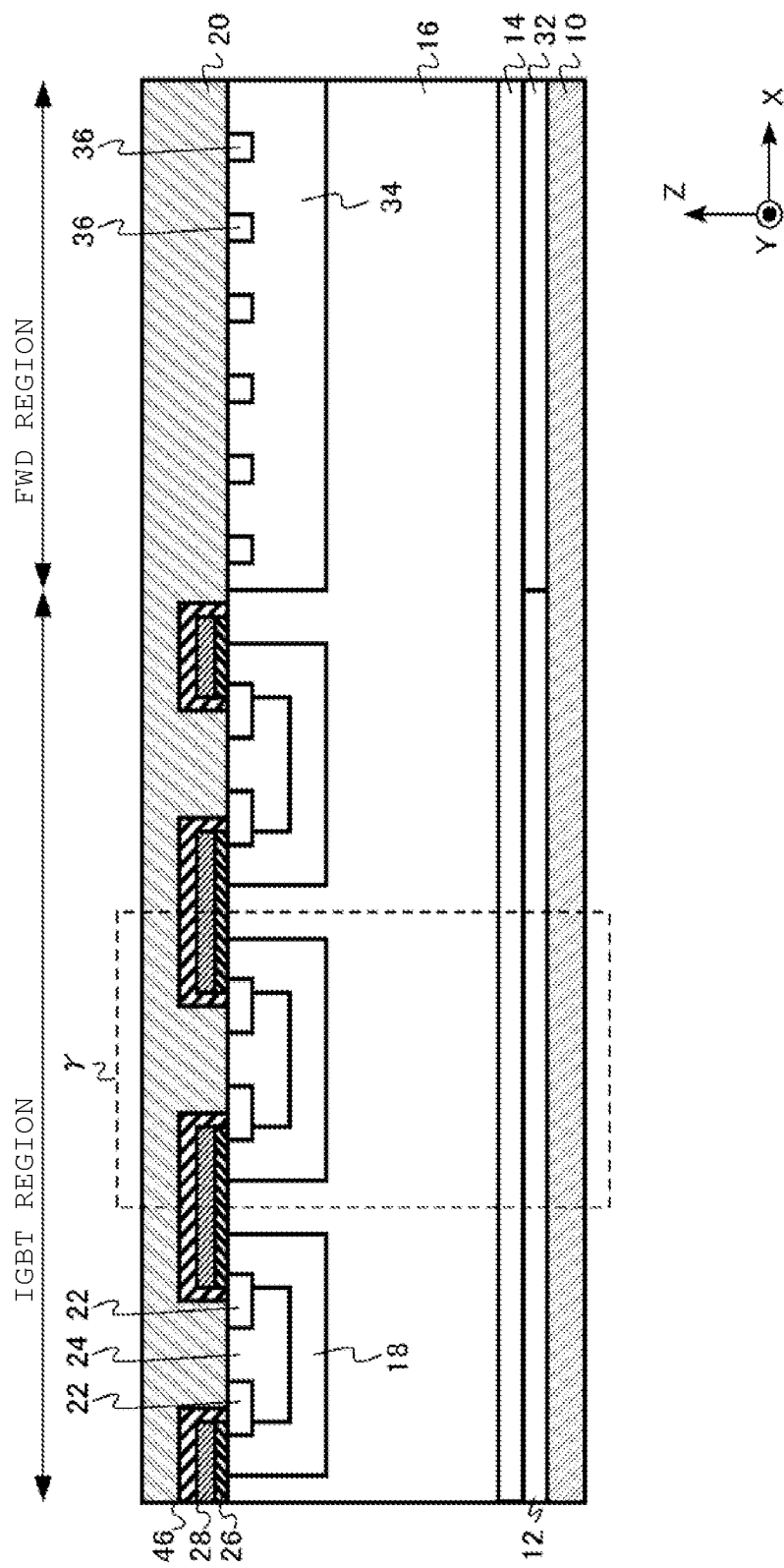
FIG. 6 is a schematic cross sectional view of a portion of a semiconductor device according to a sixth embodiment.

FIG. 6 is a schematic cross sectional view of the semiconductor device according to the sixth embodiment.

The IGBT of the embodiment is a so-called planar-type IGBT. As illustrated in FIG. 6, a gate insulating film 26 and a gate electrode 28 are provided on the semiconductor substrate surface, but are not within a trench penetrating into the semiconductor substrate. Further, an interlayer insulating film 46 is provided between the gate electrode 28 and the emitter electrode 20. Also, a trench structure is not provided in the FWD region.

In FIG. 6, an area indicated by a dashed rectangle γ is a repeating unit of the IGBT (transistor).

The semiconductor device of the sixth embodiment also enables both latch-up suppression in the IGBT and high speed according to an improvement of a switching speed in the FWD, hence to improve the operating characteristics, similarly to the first embodiment.

As mentioned above, the example embodiments have been described such that the first conductivity type is a p type and the second conductivity type is an n type; however, the first conductivity type may be an n type and the second conductivity type may be a p type.

Further, the example embodiments have been described with silicon (Si) taken as an example of semiconductor substrate and semiconductor; however, other substrate materials, such as silicon carbide (SiC) and GaN, may be used other than silicon (Si).

Further, the example embodiments have been described such that the collector electrode of the IGBT and the cathode electrode of the FWD, and the emitter electrode of the IGBT and the anode electrode of the FWD are physically formed in common; however, they may be formed independently (physically separated).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode disposed on a first surface of a semiconductor substrate;
a second electrode disposed on a second surface of the semiconductor substrate, the second surface opposite the first surface; and
a first semiconductor region having a first conductivity type and disposed between the first and second electrodes, wherein
a first element region of the semiconductor substrate includes:
a collector region of a second conductivity type disposed between the first semiconductor region and the first electrode;
a first body region of the second conductivity type disposed between the first semiconductor region and the second electrode;
a second body region of the second conductivity type disposed between the first body region and the second electrode and contacting the second electrode, a concentration of second conductivity type dopant in the second body region being greater than a concentration of second conductivity type dopant in the first body region;
an emitter region of the first conductivity type disposed between the first body region and the second electrode and contacting the second electrode; and
a first plurality of gate electrodes between the first and second electrodes and spaced from each other in a first direction parallel to the first surface, each gate electrode in the first plurality being adjacent to the first semiconductor region, the first body region, and the emitter region via a gate insulating film; and
a second element region of the semiconductor substrate includes:
a cathode region of the first conductivity type disposed between the first semiconductor region and the first electrode;
a first anode region of the second conductivity type disposed between the first semiconductor region and the second electrode; and
a second anode region of the second conductivity type disposed between the first anode region and the second electrode and contacting the second electrode, a concentration of second conductivity type dopant in the second anode region being greater than a concentration of second conductivity type dopant in the first anode region; and
a total second conductivity type dopant amount of the second body region in the first element region and within a first block portion of the semiconductor substrate is greater than a total second conductivity type dopant amount of the second anode layer in the second element region within a second block portion of the semiconductor substrate, the first block portion having a width in the first direction that is equal to a spacing between adjacent gate electrodes in the first plurality of gate electrodes and a length of a predetermined distance in a second direction, parallel to the first surface and perpendicular to the first direction, the second block portion having a width and a length that is the same as the first block portion.

2. The semiconductor device according to claim 1, wherein the second element region further includes:
a second plurality of gate electrodes between the first and second electrodes and spaced from each other in the first direction parallel, each gate electrode in the second plurality being adjacent to the first anode region, the first body region, and the second anode region via a gate insulating film.

3. The semiconductor device according to claim 2, wherein each gate electrode in the first and second plurality of gate electrodes extends between the second surface of the semiconductor substrate into the semiconductor substrate towards the first electrode.

4. The semiconductor device according to claim 2, wherein the second element region further includes:
a first carrier control region of the second conductivity type disposed between the first semiconductor region and the second electrode, wherein
the cathode region is provided in a first portion and second portion spaced from the first portion in the first direction, and
the first carrier control region is between the first and second portions of the cathode region.

5. The semiconductor device according to claim 1, wherein each gate electrode in the first plurality of gate electrodes extends between the second surface of the semiconductor substrate into the semiconductor substrate towards the first electrode.

6. The semiconductor device according to claim 1, wherein each gate electrode in the first plurality of gate electrodes is disposed on the second surface of the semiconductor substrate and extends in the first direction along the second surface.

7. The semiconductor device according to claim 1, wherein the second element region further includes:
a first carrier control region of the second conductivity type disposed between the first semiconductor region and the second electrode, wherein
the cathode region is provided in a first portion and second portion spaced from each other in the first direction, and
the first carrier control region is between the first and second portions of the cathode region.

8. The device according to claim 1, wherein the second element region further includes:
a barrier region of the first semiconductor type disposed between the first semiconductor region and the first anode region, the barrier region having a first conductivity type dopant concentration that is greater than a first conductivity type dopant concentration of the first semiconductor region.

9. The device according to claim 8, wherein the first element region includes the barrier region between the first semiconductor region and the first body region.

10. The device according to claim 1, wherein the first anode region contacts the second electrode.

11. The device according to claim 1, wherein the second element region further includes a second carrier control region of the first conductivity type disposed between the first anode region and the second electrode, the second carrier control region contacting the second electrode.

12. The device according to claim 1, wherein the second body region extends from the second surface towards the first electrode for a distance that is greater than a distance that the emitter region extends from the second surface towards the first surface.

13. The device according to claim 12, wherein the second body region has a portion that is between the emitter region and the first electrode.

14. A semiconductor device, comprising:
a plurality of transistors disposed in a transistor region of semiconductor substrate, each transistor including:
a collector layer of a first conductivity type between a first electrode disposed on a first surface of the semiconductor substrate and a second electrode disposed on a second surface of the semiconductor substrate that is opposite the first surface;
a base layer of a second conductivity type between the collector layer and the second electrode;
a first body layer of the first conductivity type between the base layer and the second electrode;
an emitter layer of the second conductivity type between the first body layer and the second electrode;
a second body layer of the first conductivity type between the first body layer and the second electrode, the second body layer having a first conductivity type dopant concentration that is higher than a first conductivity type dopant concentration of the first body layer; and
a gate electrode between the first and second electrodes, the gate electrode being adjacent to the base layer, the first body layer, and the emitter layer via a gate insulating film; and
a diode disposed in a diode region of the semiconductor substrate, the diode including:
a third electrode;
a fourth electrode provided on the third electrode with the base layer interposed therebetween;
a first anode layer of the first conductivity type provided between the base layer and the fourth electrode; and
a second anode layer of the first conductivity type provided between the first anode layer and the fourth electrode and has a first conductivity type dopant concentration that is higher than a first conductivity type dopant concentration of the first anode layer, wherein
a total dopant amount of a first conductivity type dopant in the second body layer within a first block within the transistor region with a width equal to a repeating pitch of the plurality of transistors and a length of a predetermined distance in a direction perpendicular to a repeating direction of the transistor and parallel to the first surface, is more than a total dopant amount of the first conductivity type dopant in the second anode layer within a second block within the diode region having a width and a length the same as the first block.

15. The semiconductor device according to claim 14, wherein the gate electrode extends from the second electrode toward the first electrode to be formed within a trench, the gate electrode having a first end in the emitter layer and a second end in the base layer.

16. The semiconductor device according to claim 14, wherein the fourth electrode is in contact with the first anode layer and the second anode layer.

17. The semiconductor device according to claim 14, wherein the second body layer extends from the second electrode toward the first electrode for a distance that is larger than a distance for which the second anode electrode extends from the fourth electrode towards the third electrode.

18. The semiconductor device according to claim 14, further comprising:
a barrier layer of the second conductivity type, the barrier layer having a second conductivity type dopant concentration that is higher than a second conductivity type dopant concentration of the base layer and being between the base layer and the first anode layer in the diode region.

19. A semiconductor device, comprising:
a semiconductor substrate having a first electrode disposed on a first surface and a second electrode disposed on a second surface that is opposite the first surface;
a plurality of insulated gate bipolar transistors disposed in a transistor region of semiconductor substrate, the insulated gate bipolar transistors repeated in a first direction that is parallel to the first surface, the first electrode being an emitter electrode for the insulated gate bipolar transistors and the second electrode being a collector electrode for the insulated gate bipolar transistors, each insulated gate bipolar transistor including a gate electrode adjacent via a gate insulating film to a first body layer of a first conductivity type, a second body layer of the first conductivity type, and an emitter layer of a second conductivity type, the second body layer have a first conductivity type dopant concentration that is greater than a first conductivity type dopant concentration of the first body layer and contacting the second electrode; and
a diode disposed in a diode region of the semiconductor substrate that is adjacent to the transistor region, the first electrode being a cathode electrode for the diode and the second electrode being an anode electrode for the diode, the diode including a cathode layer of the second conductivity type contacting the first electrode, a first anode layer of the first conductivity type between the cathode layer and the second electrode, and a second anode layer of the first conductivity type between the first anode layer and the second electrode, the second anode layer having a first conductivity type dopant concentration that is greater than a first conductivity type dopant concentration of the first anode layer, the second anode layer contacting the second electrode, wherein a total dopant amount of a first conductivity type dopant in the second body layer within a first block within the transistor region with a width equal to a repeating pitch of the plurality of insulated gate bipolar transistors and a length of a predetermined distance in a second direction perpendicular to the first direction and parallel to the first surface, is more than a total dopant amount of the first conductivity type dopant in the second anode layer within a second block within the diode region having a width and a length the same as the first block.

20. The device according to claim 19, wherein gate electrodes of the plurality of insulated gate bipolar transistors are each provided a trench extending from the second surface into the semiconductor substrate.

* * * * *